US009921606B2

United States Patent
Ecker et al.

(10) Patent No.: US 9,921,606 B2
(45) Date of Patent: Mar. 20, 2018

(54) LOW-PROFILE SWING GATE TO SUPPORT SERVICE ELEMENT INTERFACE HARDWARE

(71) Applicant: International Business Machines Corporation, Armonk, NY (US)

(72) Inventors: Richard M. Ecker, Poughkeepsie, NY (US); Steven C. McIntosh, Kingston, NY (US); Robert K. Mullady, Highland, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/228,185

(22) Filed: Aug. 4, 2016

(65) Prior Publication Data

US 2017/0235329 A1    Aug. 17, 2017

Related U.S. Application Data

(62) Division of application No. 15/045,483, filed on Feb. 17, 2016, now Pat. No. 9,442,513.

(51) Int. Cl.

| G06F 1/16 | (2006.01) |
|---|---|
| H05K 7/14 | (2006.01) |
| G06F 1/18 | (2006.01) |
| H05K 7/16 | (2006.01) |

(Continued)

(52) U.S. Cl.
CPC .............. *G06F 1/1601* (2013.01); *G06F 1/16* (2013.01); *G06F 1/181* (2013.01); *G06F 3/023* (2013.01); *G06F 3/0227* (2013.01); *H05K 7/1494* (2013.01); *H05K 7/16* (2013.01)

(58) Field of Classification Search
CPC ......... G06F 1/1601; G06F 1/181; H05K 7/16; H05K 7/1494; H05K 5/0017
See application file for complete search history.

(56) References Cited

U.S. PATENT DOCUMENTS

| 5,559,670 A | 9/1996 | Flint et al. |
|---|---|---|
| 6,005,767 A | 12/1999 | Ku et al. |
| 6,353,532 B1 | 3/2002 | Landrum et al. |

(Continued)

FOREIGN PATENT DOCUMENTS

EP    0577055 A2    1/1994

OTHER PUBLICATIONS

IBM, "IBM zEnterprise EC12", provided by inventor on Feb. 8, 2013, <http://ibmtvdemo.edgesuite.net/servers/z/demos/zEnterprise_Radiator_Product_Tour/index.html>.

(Continued)

*Primary Examiner* — Dimary Lopez Cruz
*Assistant Examiner* — Abhishek Rathod
(74) *Attorney, Agent, or Firm* — Isaac J. Gooshaw

(57) ABSTRACT

An apparatus for positioning service element interface devices is provided. A gate is affixed to a computing rack by a gate hinge, wherein the gate hinge rotates on a first axis. A first tray affixed to the gate at a side edge of the first tray. A second tray affixed to the first tray at a bottom edge of the first tray by a hinge that rotates on a second axis that is perpendicular to the first axis. A first display and a first keyboard affixed to an outer surface of the first tray. A second display and a second keyboard affixed to an outer surface of the second tray.

4 Claims, 11 Drawing Sheets

(51) Int. Cl.
*G06F 3/02* (2006.01)
*G06F 3/023* (2006.01)

(56) References Cited

U.S. PATENT DOCUMENTS

| | | | |
|---|---|---|---|
| 6,490,154 B2 | 12/2002 | Thompson | |
| 6,583,989 B1 | 6/2003 | Guyer et al. | |
| 6,692,093 B1 | 2/2004 | Park et al. | |
| 6,865,075 B2 | 3/2005 | Oakley | |
| 6,945,412 B2 | 9/2005 | Felcman et al. | |
| 7,016,191 B2 * | 3/2006 | Miyamoto | G11B 33/144 |
| | | | 361/679.33 |
| 7,057,892 B2 | 6/2006 | Miyamoto et al. | |
| 7,156,351 B2 | 1/2007 | Wang et al. | |
| 7,352,415 B1 | 4/2008 | Geronimi | |
| 7,425,947 B1 | 9/2008 | Tseng et al. | |
| 7,505,255 B2 | 3/2009 | Wu | |
| 7,513,579 B2 | 4/2009 | Nay et al. | |
| 7,566,033 B2 | 7/2009 | Schwager et al. | |
| 7,894,194 B2 | 2/2011 | Shih et al. | |
| 7,980,088 B2 | 7/2011 | LeClear et al. | |
| 8,456,843 B2 | 6/2013 | Wang et al. | |
| 8,472,174 B2 | 6/2013 | Idems et al. | |
| 8,593,578 B1 | 11/2013 | Geronimi | |
| 8,627,219 B2 | 1/2014 | Wang et al. | |
| 8,678,524 B2 | 3/2014 | Green | |
| 9,047,045 B2 | 6/2015 | Gambon et al. | |
| 9,232,669 B2 | 1/2016 | Love, II et al. | |
| 2005/0063145 A1 | 3/2005 | Homer et al. | |
| 2005/0128690 A1 | 6/2005 | Chuang et al. | |
| 2005/0173357 A1 | 8/2005 | McClain et al. | |
| 2006/0077636 A1 | 4/2006 | Kim | |
| 2006/0261220 A1 | 11/2006 | Lee et al. | |
| 2008/0123284 A1 | 5/2008 | Jaramillo et al. | |
| 2008/0232053 A1 | 9/2008 | Kendall et al. | |
| 2008/0284300 A1 | 11/2008 | Wu et al. | |
| 2009/0190293 A1 | 7/2009 | Shih et al. | |
| 2010/0060571 A1 | 3/2010 | Chen et al. | |
| 2011/0225537 A1 | 9/2011 | Wang et al. | |
| 2012/0309470 A1 | 12/2012 | Park et al. | |
| 2013/0081229 A1 | 4/2013 | Hirano | |
| 2013/0114197 A1 * | 5/2013 | Leigh | G06F 1/1601 |
| | | | 361/679.04 |
| 2013/0120922 A1 | 5/2013 | Castle et al. | |
| 2015/0013107 A1 | 1/2015 | Shin et al. | |
| 2016/0224058 A1 | 8/2016 | Ecker et al. | |

OTHER PUBLICATIONS

IBM, "IBM zEnterprise 114", provided by inventor on Feb. 8, 2013, <http:/libmtvdemo.edgesuite.net/servers/z/demos/zenterprise_114/index.html>.

"Dell™ Server Rack Infrastructure—1U KMM Rack Console", Dell. As noted by inventor in search report dated Jul. 10, 2014.

U.S. Appl. No. 14/612,523, filed Feb. 3, 2015 ; Entitled "Low-Profile Swing Gate to Support Service Element Interface Hardware".

U.S. Appl. No. 15/045,483, filed Feb. 17, 2016; Entitled "Low-Profile Swing Gate to Support Service Element Interface Hardware".

* cited by examiner

LOW-PROFILE SWING GATE TO SUPPORT SERVICE ELEMENT INTERFACE HARDWARE

BACKGROUND OF THE INVENTION

The present invention relates generally to the field of racks for computing devices, and more particularly to a rack-mounted service elements.

A computing rack is a frame or enclosure for mounting multiple equipment modules. Formal standards define a variety of sizes of racks. For example, the International Electrotechnical Commission ("IEC") promulgates standard IEC 60297, which specifies dimensions of mechanical structures for what are commonly referred to as 19-inch racks. Each module for a 19-inch rack has dimensions that conform to the standard, such as a front panel that is 19 inches wide, including edges or ears that protrude on each side which allow the module to be fastened to the rack frame. The height of a module can be referred to in rack units, denoted by the unit "U" (or, alternatively, "RU"). For 19-inch racks, 1 U equals 1.752 inches. An industry standard rack cabinet is 42 U tall. Rack-mounted computing systems include mainframes and other computing systems or devices that are enclosed within or mounted to a rack.

A service element (an "SE") is part of the hardware control system for a mainframe. Some mainframes use laptop computers as SEs. The SE of a mainframe is used primarily by a user, such as a customer engineer (a "CE"), to install, start, or service the mainframe.

SUMMARY

According to one embodiment of the present invention, an apparatus for positioning service elements is provided. The apparatus comprises: a gate affixed to a computing rack by a gate hinge, wherein the gate hinge rotates on a vertical axis; a first tray affixed to the gate at a side edge of the first tray; a second tray affixed to the first tray at a bottom edge of the first tray by a hinge that rotates on a horizontal axis; a first display and a first keyboard affixed to an outer surface of the first tray; and a second display and a second keyboard affixed to an outer surface of the second tray.

DETAILED DESCRIPTION

Embodiments of the present invention provide a low-profile service element ("SE") gate. Further, embodiments provide a swing to remotely integrate at least one interface device, which is a piece of interface hardware associated with an SE, such as a keyboard or a display. In one embodiment, the SE gate positions at least one interface device. For example, the SE gate positions a first display and keyboard on a first side and a second display and keyboard on a second side. In one embodiment, the SE gate is affixed to a computer rack by a hinge. Embodiments provide for reduced weight and airflow impedance while positioning interface devices for one or more SEs.

Embodiments of the present invention will now be described in detail with reference to the Figures, in which similar elements are depicted with like reference numbers.

Figure 1:
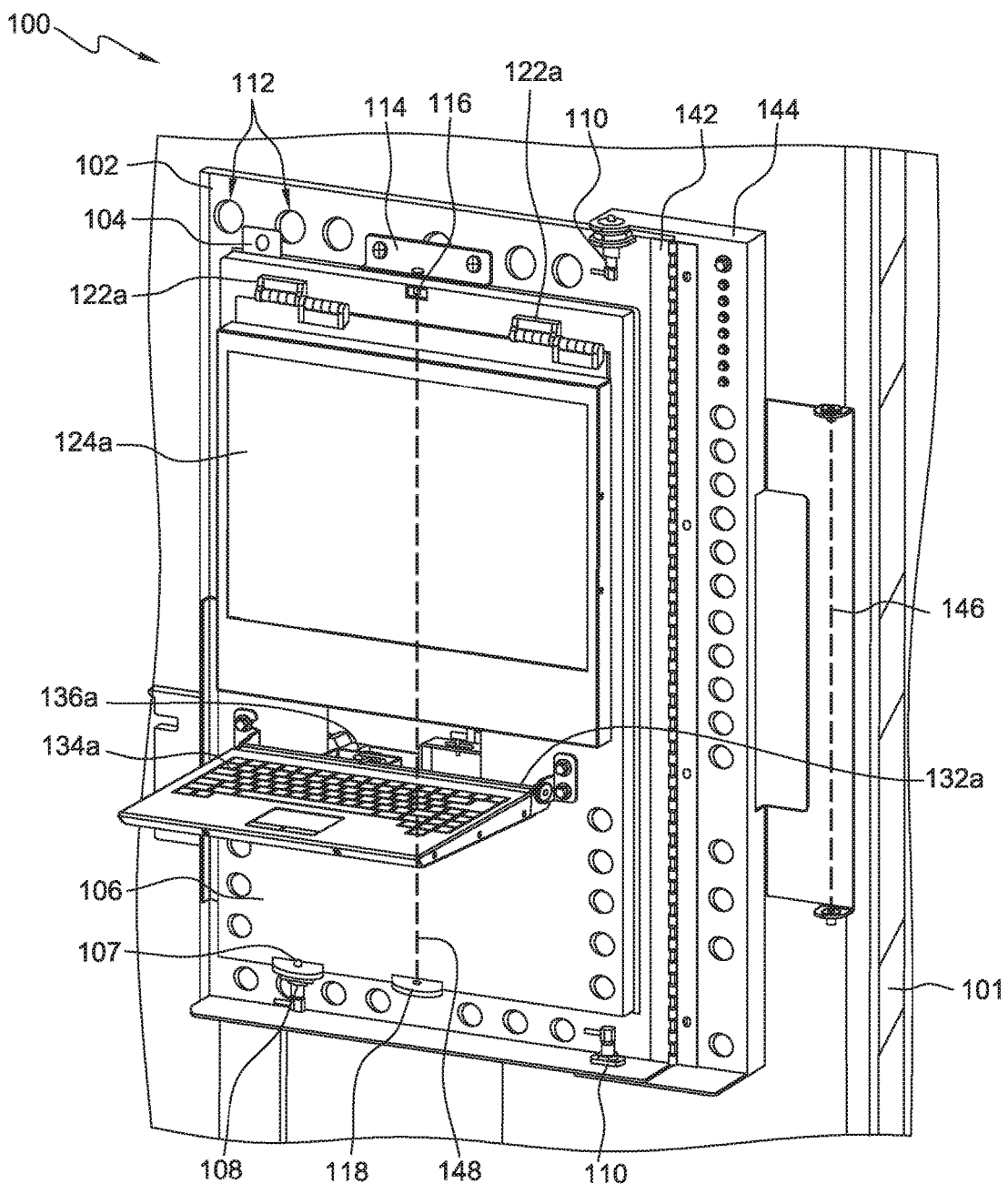
FIG. 1 is an axonometric view of a low-profile service element gate, in accordance with an embodiment of the present invention.

FIG. 1 is an axonometric view of a low-profile service element gate in accordance with an embodiment of the present invention.

SE gate 100 includes tray 102, which is affixed to frame 101 by primary hinge 144. In one embodiment, frame 101 is a portion of a computing rack. The size of the computing rack may comply with an industry standard (e.g., a 19-inch rack) or may be non-standard (e.g., a custom 24-inch rack). Primary hinge 144 allows rotation of tray 102 at axis 146, which is parallel to where primary hinge 144 is affixed to frame 101. In one embodiment, the terms vertical and horizontal generally refer to directions perpendicular to one another. For example, when the computing rack is oriented for normal operation, vertical refers to a direction parallel to the force of gravity and horizontal refers to a direction perpendicular with the force of gravity.

Tray 102 is affixed to primary hinge 144 by secondary hinge 142. Tray 102 is affixed to secondary hinge 142 by hinge pins 110. Secondary hinge 142 allows rotation of tray 102 at an axis substantially parallel to axis 146. In the depicted embodiment, tray 102 includes a set of apertures 112. The set of apertures 112 reduce the material of tray 102, thereby providing weight reduction and less impedance to airflow. As depicted, primary hinge 144 and backboard 106 include apertures that provide weight and airflow impedance reduction in a manner similar to that of apertures 112. In one embodiment, such apertures are numbered and positioned to reduce weight without compromising structural integrity.

Backboard 106 is affixed to tray 102 at pin 116 and rotation point 118. Backboard 106 can rotate along axis 148, which is an axis that runs from pin 116 to rotation point 118. Axis 148 is substantially parallel to axis 146. Pin 116 is affixed to tray 102 by plate 114. In the depicted embodiment, plate 114 is affixed to a front surface of tray 102 and is shaped such that position pin 116 is positioned away from tray 102, thereby enabling flange 104 to interact with a front surface of tray 102 in a first position (as depicted in FIG. 1)

and a second position, in which backboard 106 is rotated approximately one-hundred eighty degrees about axis 148.

Tray 102 includes edges defining an opening through which portions of backboard 106 passes when backboard 106 rotates around center axis 148, thereby allowing rotation of backboard 106. In the depicted embodiment, the opening defined by the edges of tray 102 have a width and length at least as large as a width and length of backboard 106. Flange 104 protrudes from backboard 106. In the depicted embodiment, flange 104 contacts a front surface of tray 102, thereby hindering further rotation of backboard 106 beyond a preconfigured point. As depicted, flange 104 hinders rotation of backboard 106 beyond a one-hundred eighty degree range of rotation. Retaining pin 108 has an engaged position and a disengaged position. In the engaged position, retaining pin 108 engages receiver 107 of backboard 106, in which case retaining pin 108 functions to hinder the rotation of backboard 106. In the disengaged position, retaining pin 108 does not engage receiver 107. For example, retaining pin 108 does not engage receiver 107 if backboard 106 is rotated such that retaining pin 108 does not align with receiver 107. In another example, retaining pin 108 does not engage receiver 107 if retaining pin 108 is moved sufficiently far in a direction away from receiver 107, such as when a user disengages retaining pin 108 in order to rotate backboard 106.

Display 124a and keyboard 134a are affixed to a surface of backboard 106. Display 124a and keyboard 134a are interface devices that allow a user to interact with an SE. For example, display 124a and keyboard 134a allow the user to install, start, or service a computing device (e.g., a mainframe) by interacting with an SE that is in communication with the mainframe.

Display 124a is affixed to backboard 106 by SE hinge 122a. Keyboard 134a is affixed to backboard 106 by SE hinge 132a. In various embodiments, SE hinge 122a is a friction hinge, detent hinge, or other type of hinge that holds a position within a range of motion. In various embodiments, SE hinge 132a is a friction hinge, detent hinge, other type of hinge that holds a position within a range of motion, or any other type of hinge that allows rotation along an axis parallel to an edge of keyboard 134a. The angle of rotation of each of SE hinge 122a and SE hinge 132a is adjustable. For example, a user adjusts the angle of display 124a and keyboard 134a to improve the ergonomics of accessing display 124a and keyboard 134a. SE hinge 122a and SE hinge 132a allow display 124a and keyboard 134a to move between a stowed position and a deployed position. In the stowed position, display 124a (or keyboard 134a) is substantially parallel to backboard 106. In the deployed position, the angle between display 124a (or keyboard 134a) and backboard 106 is increased. In FIG. 1, display 124a is depicted in the stowed position and keyboard 134a is depicted in the deployed position.

Locking mechanism 136a is movable between an engaged position and a disengaged position. When in the engaged position, locking mechanism 136a hinders rotation of SE hinge 132a. For example, a user moves locking mechanism 136a to an engaged position while keyboard 134a is in a deployed position. In this case, locking mechanism 136a hinders changes in the angle of rotation of SE hinge 132a, thereby hindering the movement of keyboard 134a from the deployed position. If locking mechanism 136a is left in the unengaged position, the force of typing on keyboard 134a may cause a change in the angle of rotation of SE hinge 132a toward the stowed position.

In one embodiment, each of primary hinge 144 and secondary hinge 142 allow rotation along axes. The axis of rotation of primary hinge 144 is parallel to the axis of rotation of secondary hinge 142. For example, each of primary hinge 144 and secondary hinge 142 allow rotation of up to ninety degrees, for a total of one-hundred eighty degrees. In some embodiments, SE gate 100 is implemented in a mainframe environment having two adjacent computing racks, often referred to as a Z Frame and an A Frame. In this embodiment, tray 102 can rotate to various angles. For example, tray 102 can rotate from a position in front of the Z Frame, through a position perpendicular with the Z Frame and A Frame, to a position in front of the A Frame.

Figure 2:
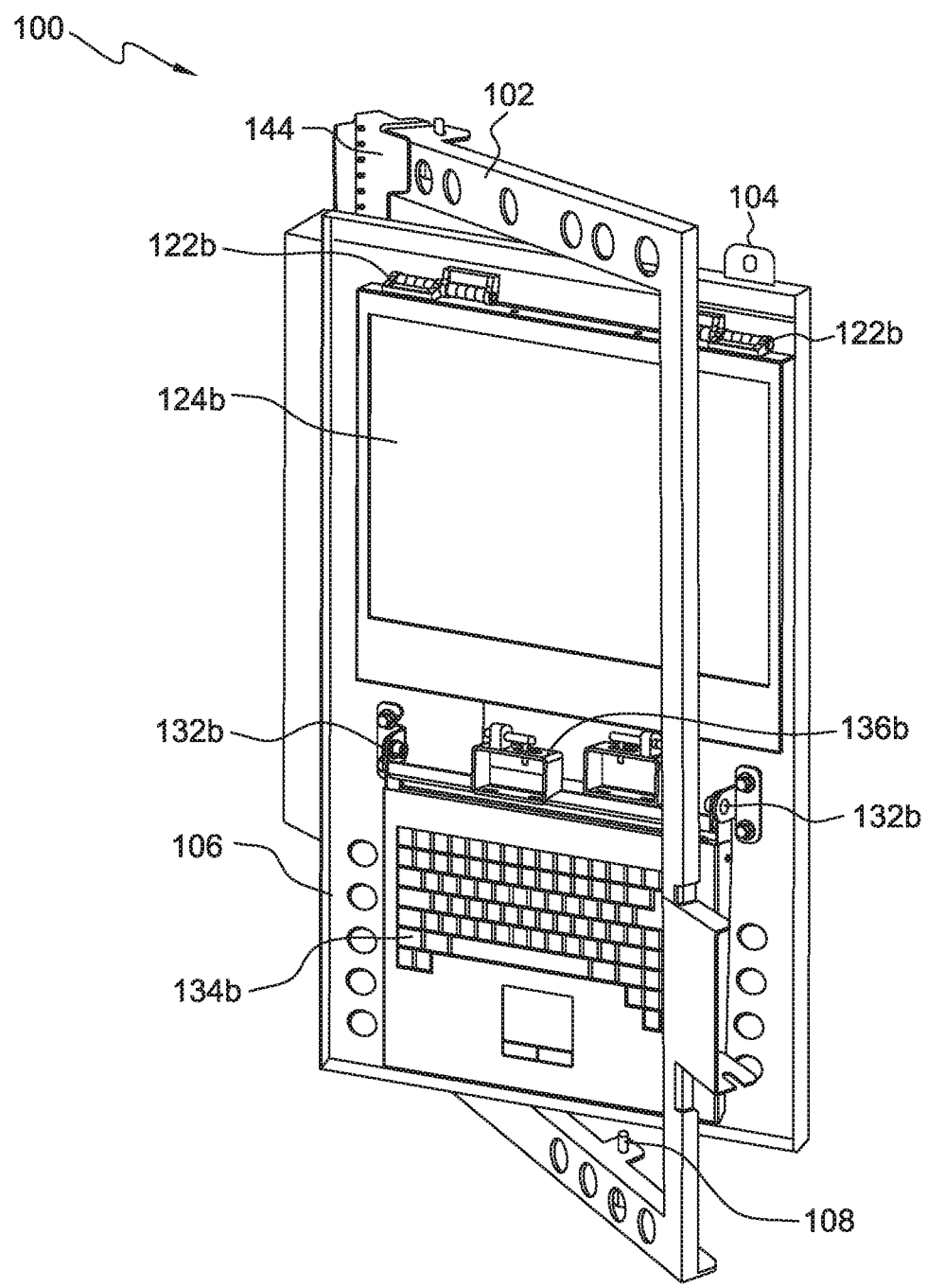
FIG. 2 is an axonometric view of the low-profile service element gate of FIG. 1, in accordance with an embodiment of the present invention.

FIG. 2 is an axonometric view of the low-profile service element gate of FIG. 1, in accordance with an embodiment of the present invention.

FIG. 2 depicts tray 102 affixed to a computing rack by primary hinge 144.

Relative to the view depicted in FIG. 1, backboard 106 has been rotated in this figure. As depicted in FIG. 2, flange 104 is not hindering further rotation of backboard 106, as it is not in contact with tray 102. Retaining pin 108 is depicted in the disengaged position. As depicted in FIG. 2, backboard 106 is rotated such that retaining pin 108 does not align with receiver 107 (see FIG. 1). Further, tray 102 is rotated to a position perpendicular to frame 101 (see FIG. 1).

Display 124b and keyboard 134b are affixed to a surface of backboard 106 that is opposite the surface to which display 124a (see FIG. 1) and keyboard 134a (see FIG. 1) are affixed. Display 124b and keyboard 134b are interface devices that allow a user to interact with an SE. For example, display 124b and keyboard 134b allow the user to install, start, or service a computing device (e.g., a mainframe) by interacting with an SE that is in communication with the mainframe.

Display 124b is affixed to backboard 106 by SE hinge 122b. Keyboard 134b is affixed to backboard 106 by SE hinge 132b. In various embodiments, SE hinge 122b is a friction hinge, detent hinge, or other type of hinge that holds a position within a range of motion. In various embodiments, SE hinge 132b is a friction hinge, detent hinge, other type of hinge that holds a position within a range of motion, or any other type of hinge that allows rotation along an axis parallel to an edge of keyboard 134b. The angle of rotation of each of SE hinge 122b and SE hinge 132b is adjustable. For example, a user adjusts the angle of display 124b and keyboard 134b to improve the ergonomics of accessing display 124b and keyboard 134b. SE hinge 122b and SE hinge 132b allow display 124b and keyboard 134b to move between a stowed position and a deployed position. In the stowed position, display 124b (or keyboard 134b) is substantially parallel to backboard 106. In the deployed position, the angle between display 124b (or keyboard 134b) and backboard 106 is increased. In FIG. 2, display 124b is depicted in the stowed position and keyboard 134b is depicted in the stowed position.

Locking mechanism 136b is movable between an engaged position and a disengaged position. When in the engaged position, locking mechanism 136b hinders rotation of SE hinge 132b. For example, a user moves locking mechanism 136b to an engaged position while keyboard 134b is in a deployed position. In this case, locking mechanism 136b hinders changes in the angle of rotation of SE hinge 132b, thereby hindering the movement of keyboard 134b from the deployed position. If locking mechanism 136b is left in the unengaged position, the force of typing on keyboard 134b may cause a change in the angle of rotation of SE hinge 132b toward the stowed position.

In one embodiment, display 124b and keyboard 134b provide an interface to the same SE as do display 124a and keyboard 134a. In another embodiment, display 124b and keyboard 134b provide an interface to a different SE as do display 124a and keyboard 134a. In yet another embodiment, display 124b and keyboard 134b provide an interface to a first set of SEs and display 124a and keyboard 134a provide an interface to a second set of SEs. In various examples, none, some, or all of the SEs of the first set belong to the second set. Redundant interface devices are those that allow interaction with the same SE. Redundant interface devices may provide interfaces concurrently or exclusively. For example, display 124a and keyboard 134a provide an interface to an SE concurrently with display 124b and keyboard 134b providing an interface to the SE. In this example, two users can interact with the same SE concurrently utilizing the redundant interface elements. In another example, display 124a and keyboard 134a provide an interface to an SE exclusive of display 124b and keyboard 134b providing an interface to the SE. In this example, two users can interact with the same SE, but exclusively of one another (i.e., one at a time).

Various computing components can be mounted to frame 101. In this case, computing components are mounted to frame 101 behind tray 102. That is, tray 102 is disposed between the mounted components and display 124a (when tray 102 and backboard 106 are rotated as depicted in, for example, FIG. 1). In one embodiment, a door (not shown) is mounted to frame 101. In this embodiment, SE gate 100 is configured to allow the door to close without interference from the components of SE gate 100. For example, the door, when closed, leaves a clearance depth between the door and any mounted computing components. In this example, the clearance depth is greater than the greatest combined depth of the components of SE gate 100 (e.g., tray 102, display 124a, and display 124b). Further, the components of SE gate 100 are positioned (by, for example, primary hinge 144) within the clearance depth of the door at a position that avoids interference with the door by the components of SE gate 100.

Figure 3:
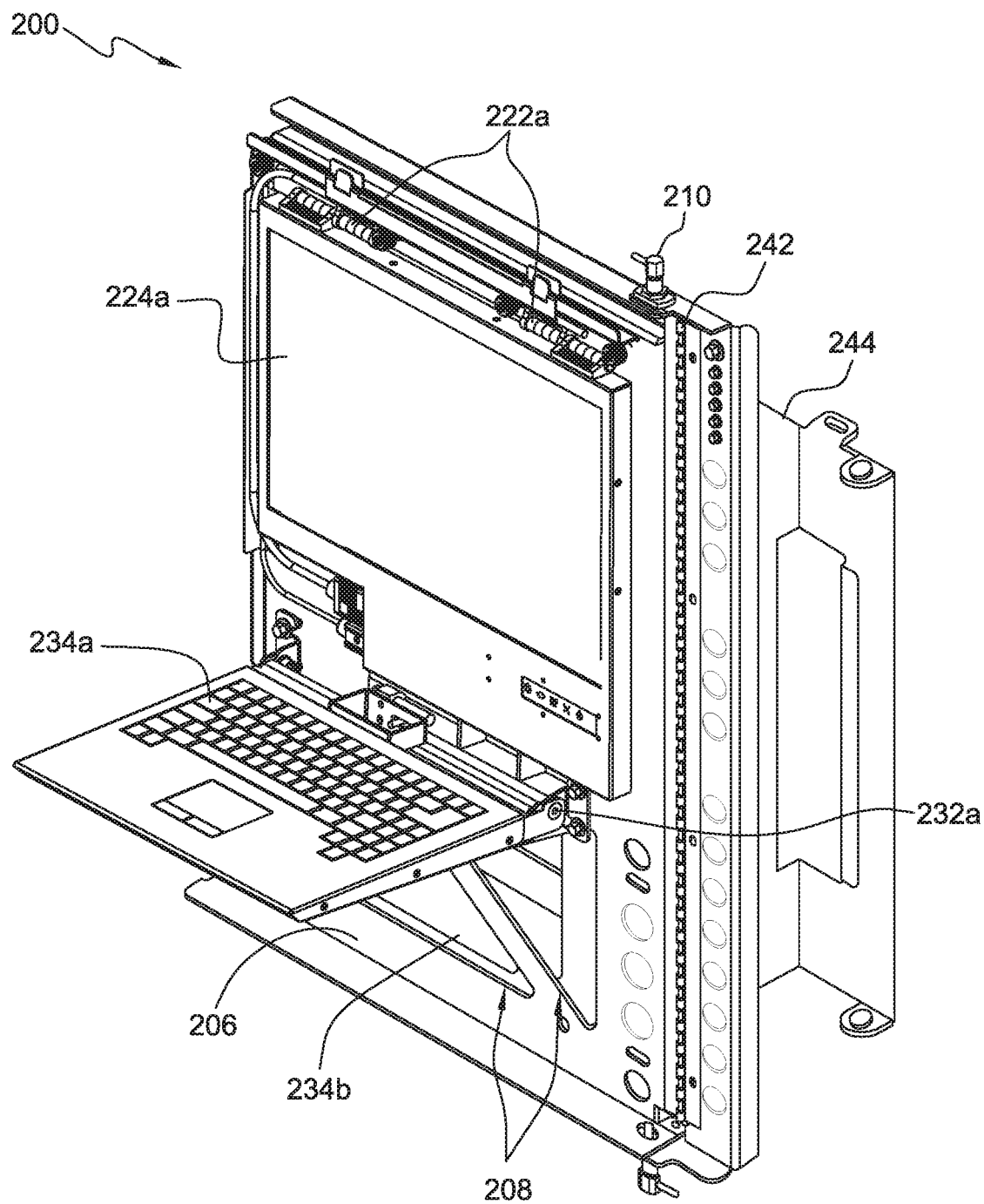
FIG. 3 is an axonometric view of a low-profile service element gate, in accordance with an embodiment of the present invention.
Figure 4:
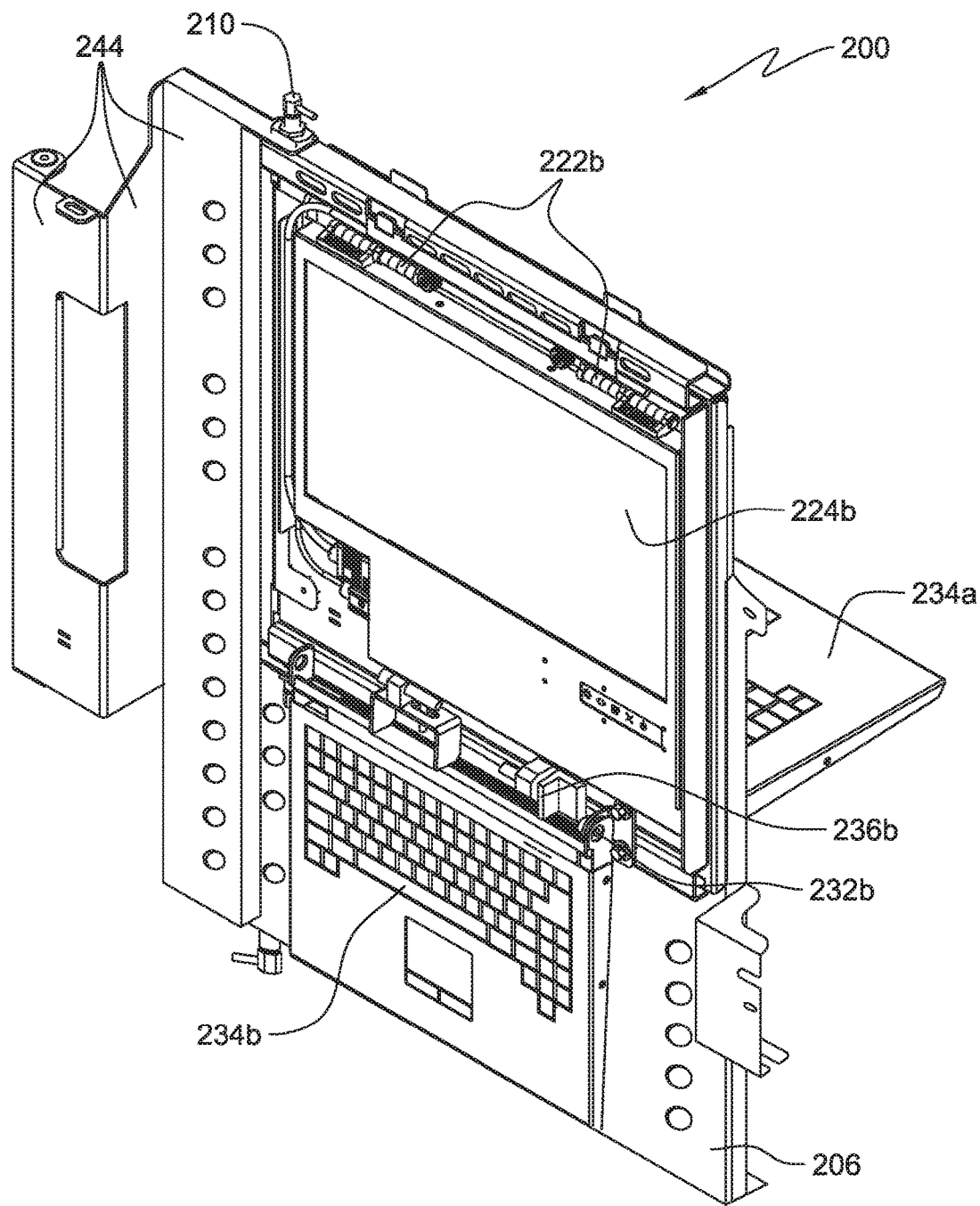
FIG. 4 is an axonometric view of the low-profile service element gate of FIG. 3, in accordance with an embodiment of the present invention.

FIG. 3 is an axonometric view of a low-profile service element gate, generally designated SE gate 200, in accordance with an embodiment of the present invention. FIG. 4 is an isometric view of the low-profile service element gate of FIG. 3, in accordance with an embodiment of the present invention. FIG. 3 and FIG. 4 depicts SE gate 200 from different angles.

In the depicted embodiment, primary hinge 244 is substantially similar to primary hinge 144, secondary hinge 242 is substantially similar to secondary hinge 142, hinge pins 210 are substantially similar to hinge pins 110, SE hinge 222a is substantially similar to SE hinge 122a, display 224a is substantially similar to display 124a, display 224b (see FIG. 4) is substantially similar to display 124b, SE hinge 232a is substantially similar to SE hinge 132a, keyboard 234a is substantially similar to keyboard 134a, and keyboard 234a is substantially similar to keyboard 234b.

Tray 206 includes edges 208, which define regions of tray 206 with material removed for weight savings and reduced airflow impedance. In the depicted configuration of such regions, a back surface of keyboard 234b is visible. However, other configurations of such regions are possible. Tray 206 is affixed to primary hinge 244 by secondary hinge 242. Tray 206 can rotate along of vertical axis of primary hinge 244. Tray 206 can also rotate along a vertical axis of second hinge 242. This double-hinge approach allows access to interface devices mounted to the SE gate at various degrees of rotation. For example, keyboard 234a and display 224a are accessible while SE gate 200 is rotated zero degrees, such as when SE gate 200 is positioned in front of a Z frame of a computing rack. Alternatively, keyboard 234b and display 224b are accessible while SE gate 200 is rotated one-hundred eighty degrees, such as when SE gate 200 is positioned in front of an A frame of a computing rack. Further, the interface devices on each side of tray 206 (i.e., keyboard 234a, display 224a, keyboard 234b, and display 224b) are simultaneously accessible when SE gate 200 is rotated ninety degrees, such as when SE gate 200 is positioned orthogonally to the computing rack.

Figure 5:
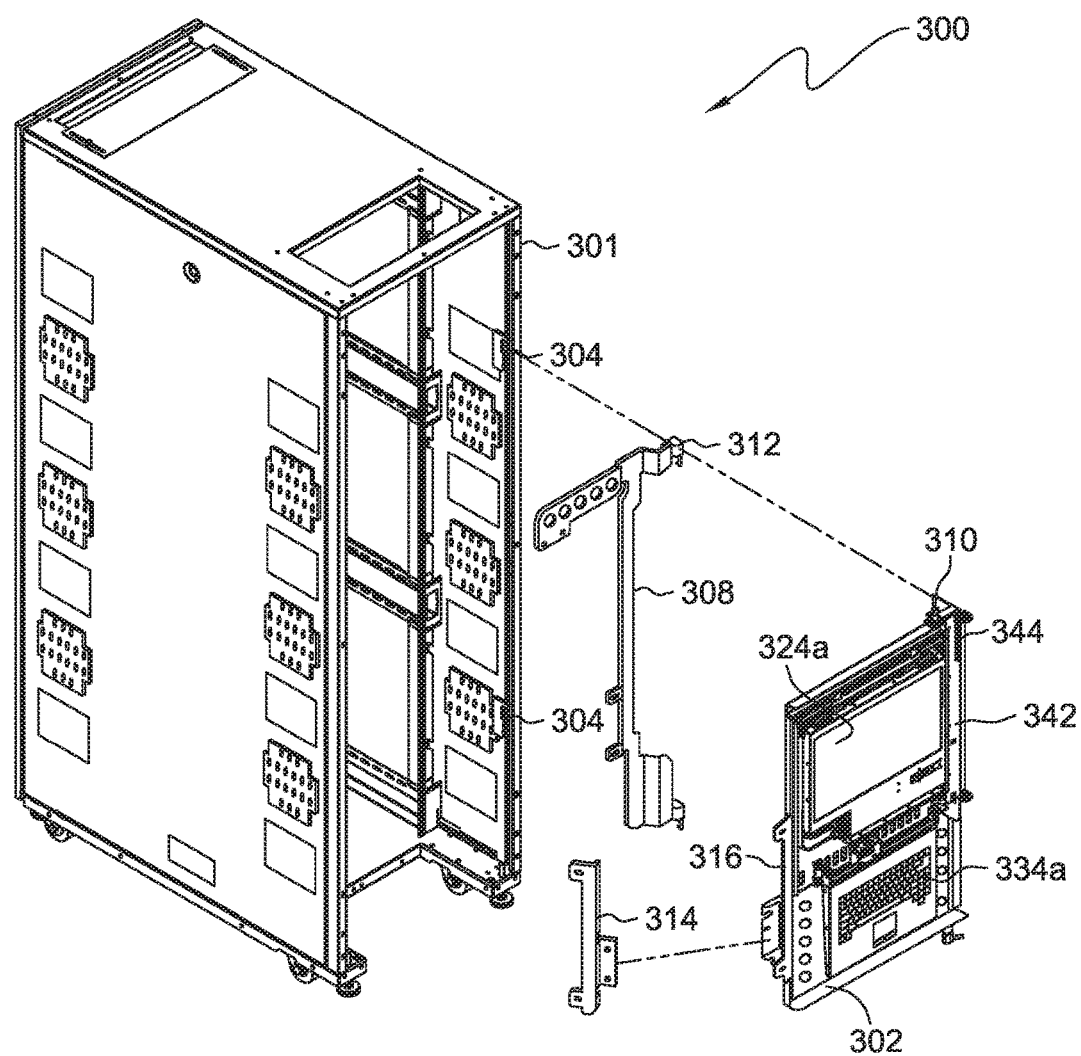
FIG. 5 is a partially exploded isometric view of a low-profile service element gate, in accordance with an embodiment of the present invention.

FIG. 5 is a partially exploded view of a low-profile service element gate, generally designated SE gate 300, in accordance with an embodiment of the present invention.

SE gate 300 includes hardware that improves the resilience of frame 301 to events such as shocks or seismic events (e.g., earthquakes). In one embodiment, this additional hardware increases the rigidity of frame 301.

SE gate 300 includes tray 302, which is substantially similar to tray 102. Primary hinge 344 is substantially similar to primary hinge 144. Brace 308 affixes to frame 301 at earthquake hinge brackets 304. Brace 308 can rotate along a vertical axis that runs between earthquake hinge brackets 304. In one embodiment, the vertical axis runs along an edge of frame 301. Tray 302 is affixed to secondary hinge 342 by hinge pins 310. Secondary hinge 342 is substantially similar to secondary hinge 142. Hinge pins 310 are substantially similar to hinge pins 110. Secondary hinge 342 affixes tray 302 to primary hinge 344. Tray 302 can rotate along a vertical axis of primary hinge 344. Tray 302 can also rotate along a vertical axis of secondary hinge 342. Latch bracket 316, when engaged, positions tray 302 relative to frame 301. Latch bracket 316 engages by affixing to frame bracket 314, which is affixed to frame 301. In one embodiment, latch bracket 316, when engaged, indirectly affixes tray 302 to frame 301 by way of frame bracket 314. In this embodiment, tray 302 affixes to frame 301 by way of latch bracket 316 together with frame bracket 314 and also by way of secondary hinge 342 together with primary hinge 344.

Display 324a is affixed to tray 302. Display 324a is substantially similar to display 124a. Keyboard 334a is affixed to tray 302. Keyboard 334a is substantially similar to keyboard 134a.

In one embodiment, tray 302 is affixed to brace 308. For example, tray 302 is affixed to brace 308 toward to a top edge of tray 302, which is an edge of tray 302 proximate display 324a. In this embodiment, mechanical stress is translated across sides of frame 301 through brace 308, tray 302, and latch bracket 316.

Figure 6:
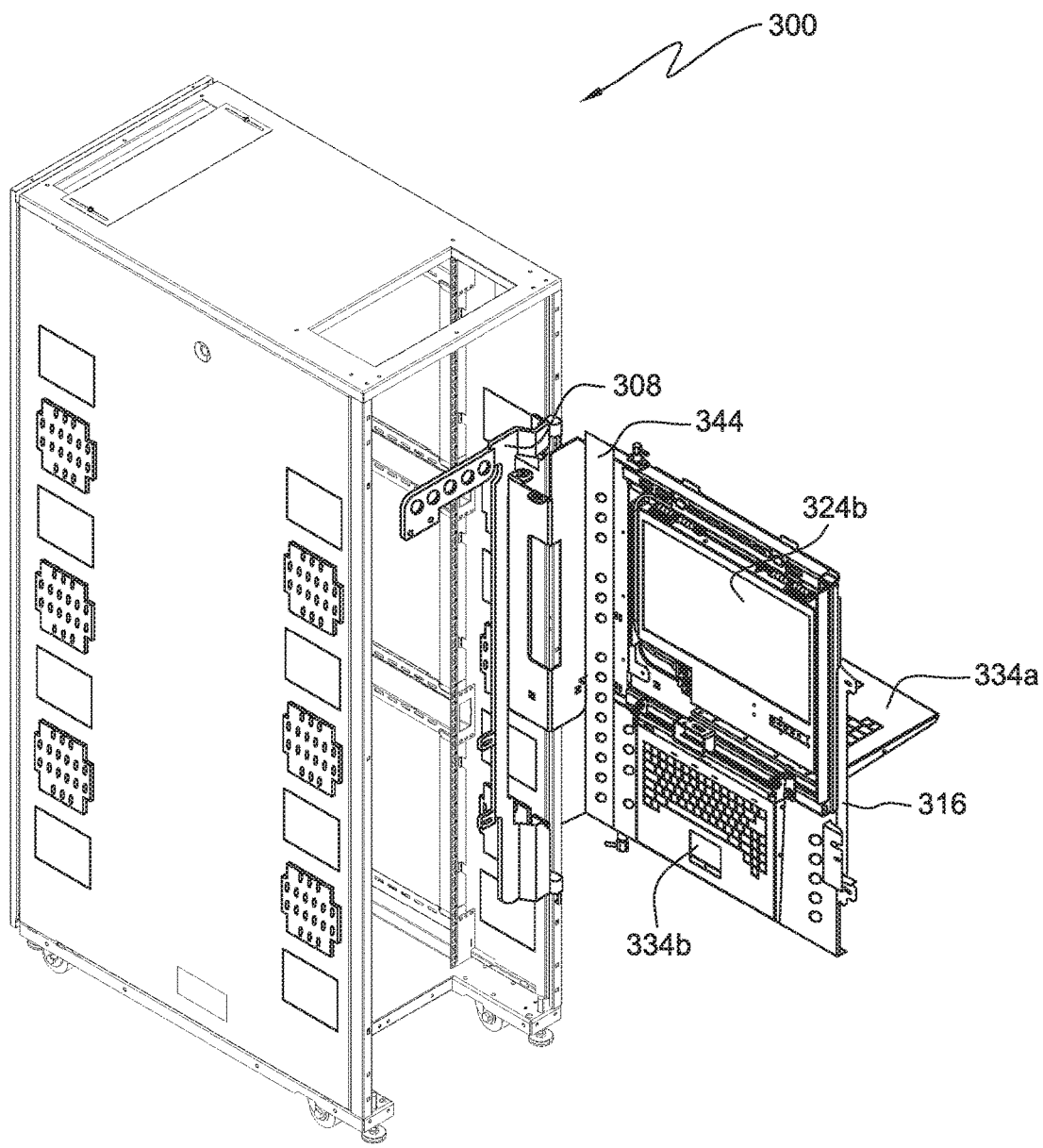
FIG. 6 is an axonometric view of the low-profile service element gate of FIG. 5, in accordance with an embodiment of the present invention.

FIG. 6 is an axonometric view of the low-profile service element gate of FIG. 5, in accordance with an embodiment of the present invention.

In the depicted embodiment, tray 302 is rotated to be approximately perpendicular to the front of frame 301. In this position, a first set of interface devices (i.e., keyboard 334a and display 324a) and a second set of interface devices (i.e., keyboard 334b and display 324b) are positioned for concurrently availability. In an example, a first user interacts with keyboard 334a and display 324a while a second user interacts with keyboard 334b and display 324b.

Brace 308 is positioned in front of frame 301, perpendicular to tray 302, such that brace 308 does not interfere with access to display 324b and keyboard 334b. In FIG. 6, keyboard 334b and display 324b are depicted in a stowed position and keyboard 334a is depicted in a deployed position.

Figure 7:
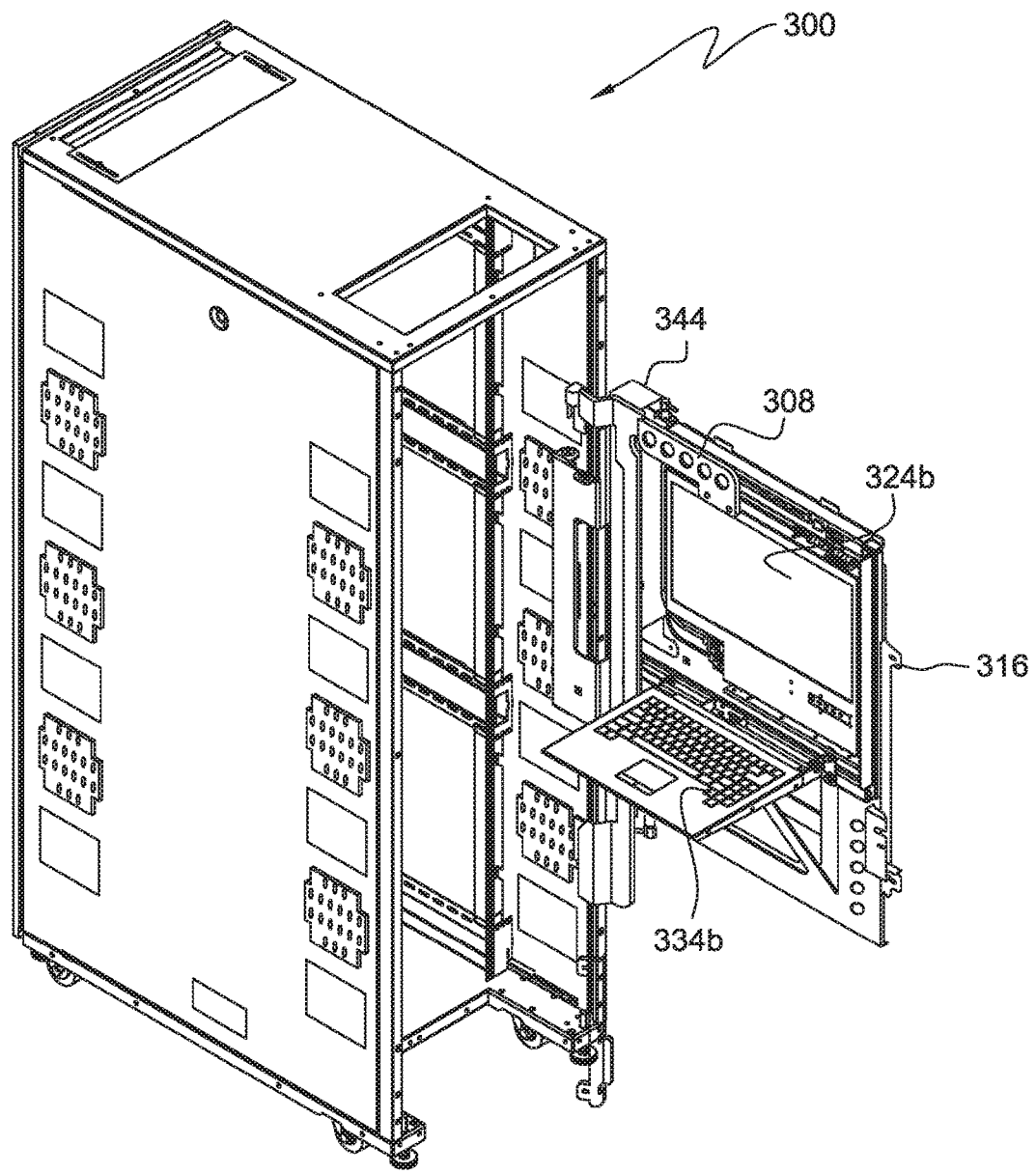
FIG. 7 is an axonometric view of the low-profile service element gate of FIG. 5, in accordance with an embodiment of the present invention.

FIG. 7 is an axonometric view of the low-profile service element gate of FIG. 5, in accordance with an embodiment of the present invention.

In the depicted embodiment, tray 302 is rotated to be approximately perpendicular to the front of frame 301. In this position, a first set of interface devices (i.e., keyboard 334a and display 324a) and a second set of interface devices (i.e., keyboard 334b and display 324b) are positioned for concurrently availability. In an example, a first user interacts with keyboard 334a and display 324a while a second user interacts with keyboard 334b and display 324b.

Brace 308 is rotated to be approximately perpendicular to the front of frame 301. In the position, brace 308 does not interfere with access to keyboard 334b. In some configurations, brace 308 interferes with access to display 324b when positioned parallel to tray 302, such as by reducing the rotational freedom of a hinge by which display 324b is affixed to tray 302. However, in other possible configurations, brace 308 reduces access to neither, one, or both of display 324b and keyboard 334b. In FIG. 7, keyboard 334a, display 324a, and display 324b are depicted in a stowed position and keyboard 334b is depicted in a deployed position.

Figure 8:
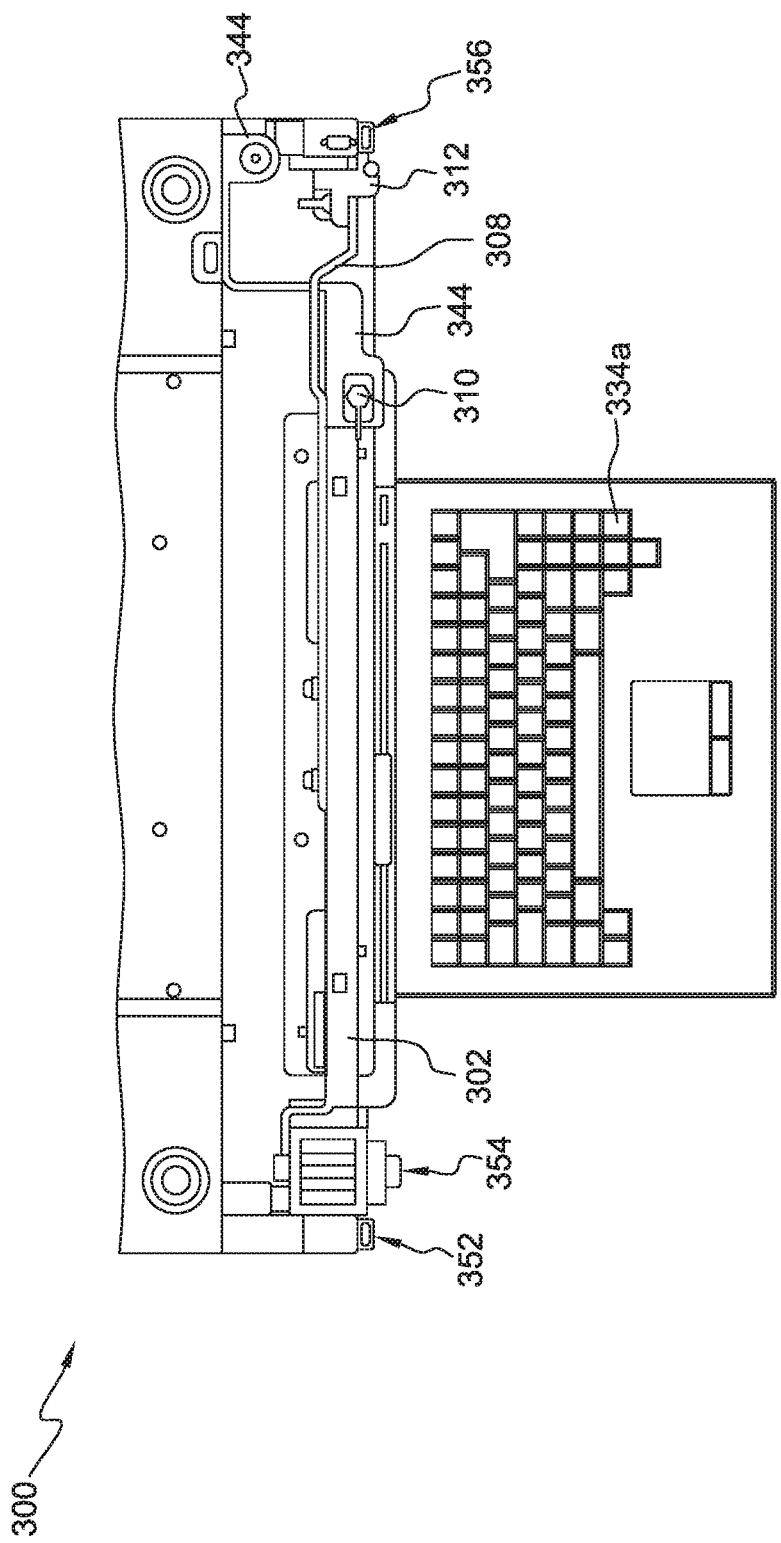
FIG. 8 is a top plan view of the low-profile service element gate of FIG. 5, in accordance with an embodiment of the present invention.

FIG. 8 is a top plan view of the low-profile service element gate of FIG. 5, in accordance with an embodiment of the present invention.

In the depicted embodiment, tray 302 and brace 308 are positioned in front of frame 301 (see FIG. 5). SE gate 300 is positioned at least partially within a space defined by frame 301. Attachment point 354 includes a latch that engages with an end of tray 302 that is distal from secondary hinge 342 to hinder movement of tray 302 by rotation of secondary hinge 342. For example, attachment point 354 helps prevent rotation of gate 300 during shipping.

Figure 9:
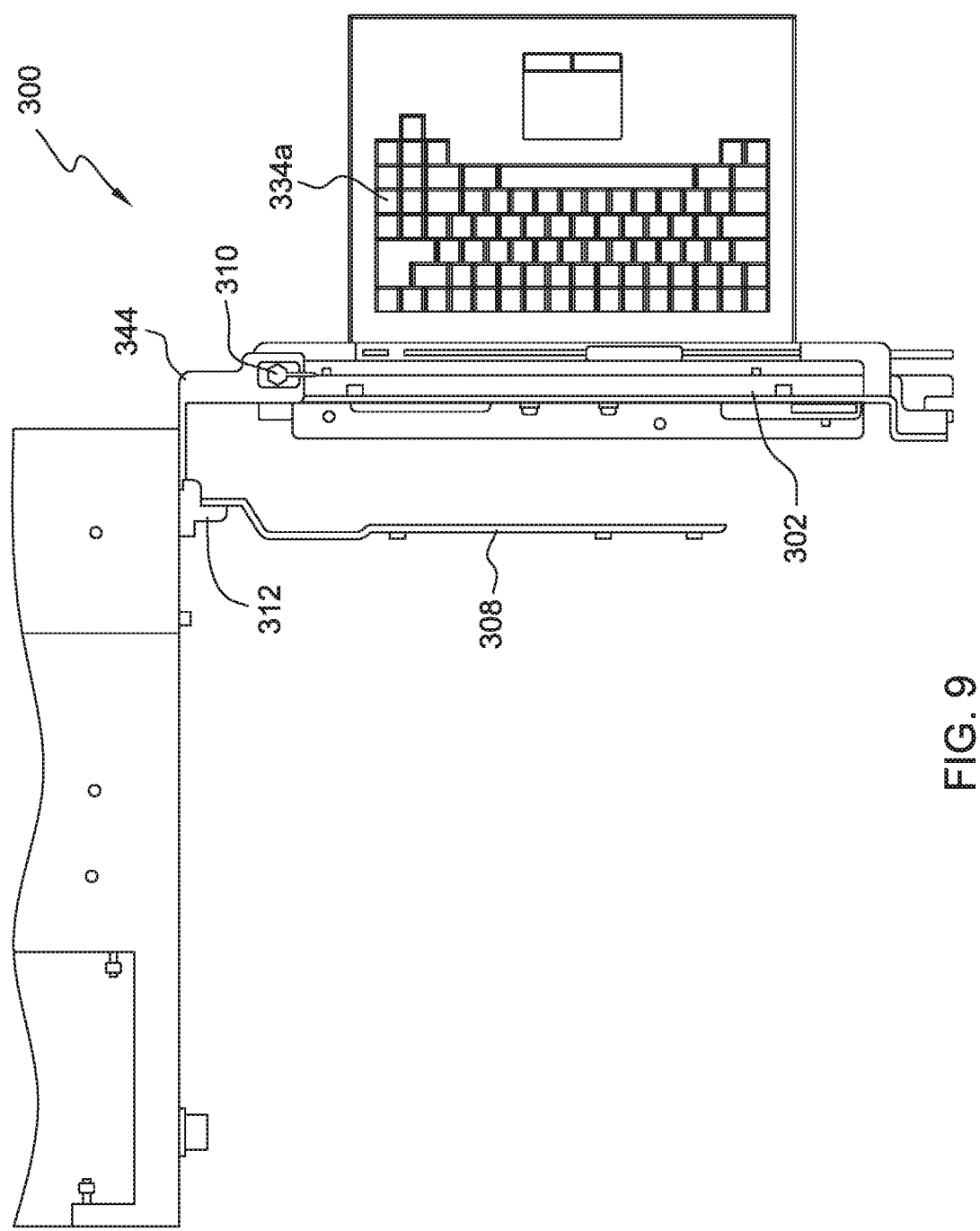
FIG. 9 is a top plan view of the low-profile service element gate of FIG. 5, in accordance with an embodiment of the present invention.

FIG. 9 is a top plan view of the low-profile service element gate of FIG. 5, in accordance with an embodiment of the present invention.

In the depicted embodiment, tray 302 and brace 308 are positioned as depicted in FIG. 7. However, in FIG. 9, keyboard 334a is in a deployed position and keyboard 334b is in a stowed position.

Various computing components can be mounted to frame 301. In this case, computing components are mounted to frame 301 behind brace 312. That is, brace 312 is disposed between the mounted components and tray 302 (when brace 312 is rotated as depicted in, for example, FIG. 8). In one embodiment, a door (not shown) is mounted to frame 301. In this embodiment, SE gate 300 is configured to allow the door to close without interference from the components of SE gate 300. For example, the door, when closed, leaves a clearance depth between the door and any mounted computing components. In this example, the clearance depth is greater than the greatest combined depth of the components of SE gate 300 (e.g., brace 312, tray 302, display 324a, and display 324b). Further, the components of SE gate 300 are positioned (by, for example, primary hinge 344) within the clearance depth of the door at a position that avoids interference with the door by the components of SE gate 300.

Figure 10:
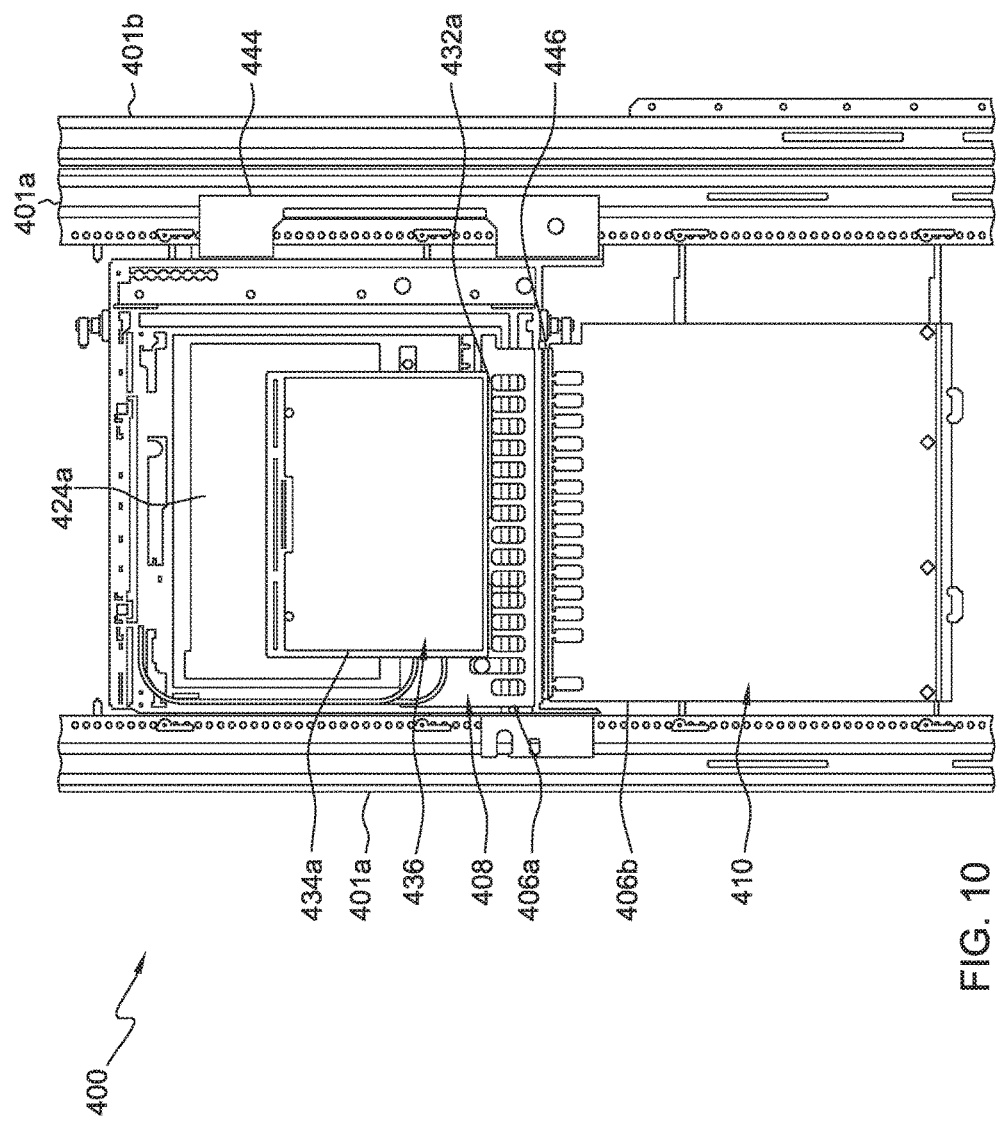
FIG. 10 is a front elevation view of a low-profile service element gate, in accordance with another embodiment of the present invention.

FIG. 10 is a front elevation view of a low-profile service element gate, in accordance with another embodiment of the present invention.

SE gate 400 includes first tray 406a, which is affixed to frame 401a by primary hinge 444. Frame 401a and frame 401b are frames of a pair of computing racks. It should be readily apparent that FIG. 10 depicts only portions of the computing racks.

In some embodiments, first tray 406a is affixed to frame 401a by a secondary hinge (not shown) that is affixed to primary hinge 444. In this embodiment, the secondary hinge is analogous to secondary hinge 142 and primary hinge 444 is analogous to primary hinge 144. In particular, in this embodiment, the secondary hinge and primary hinge 444 together allow first tray 406a to rotate one hundred eighty degrees from the depicted position to a position in front of frame 401b.

First tray 406a is affixed to primary hinge 444 at a side edge of first tray 406a that is most proximate to primary hinge 444. Display 424a and keyboard 434a are affixed to front surface 408 of first tray 406a. Keyboard 434a is affixed to front surface 408 of first tray 406a by hinge 432a, which rotates on a horizontal axis and positions keyboard 434a at various angles relative to front surface 408 of first tray 406a. In various embodiments, display 424a and display 424b (see FIG. 11) are analogous to one or both of display 124a and display 124b. In various embodiments, keyboard 434a and keyboard 434b (see FIG. 11) are analogous to one or both of keyboard 134a and keyboard 134b.

First tray 406a and second tray 406b are affixed to one another by hinge 446. Hinge 446 rotates on a horizontal axis.

Figure 11:
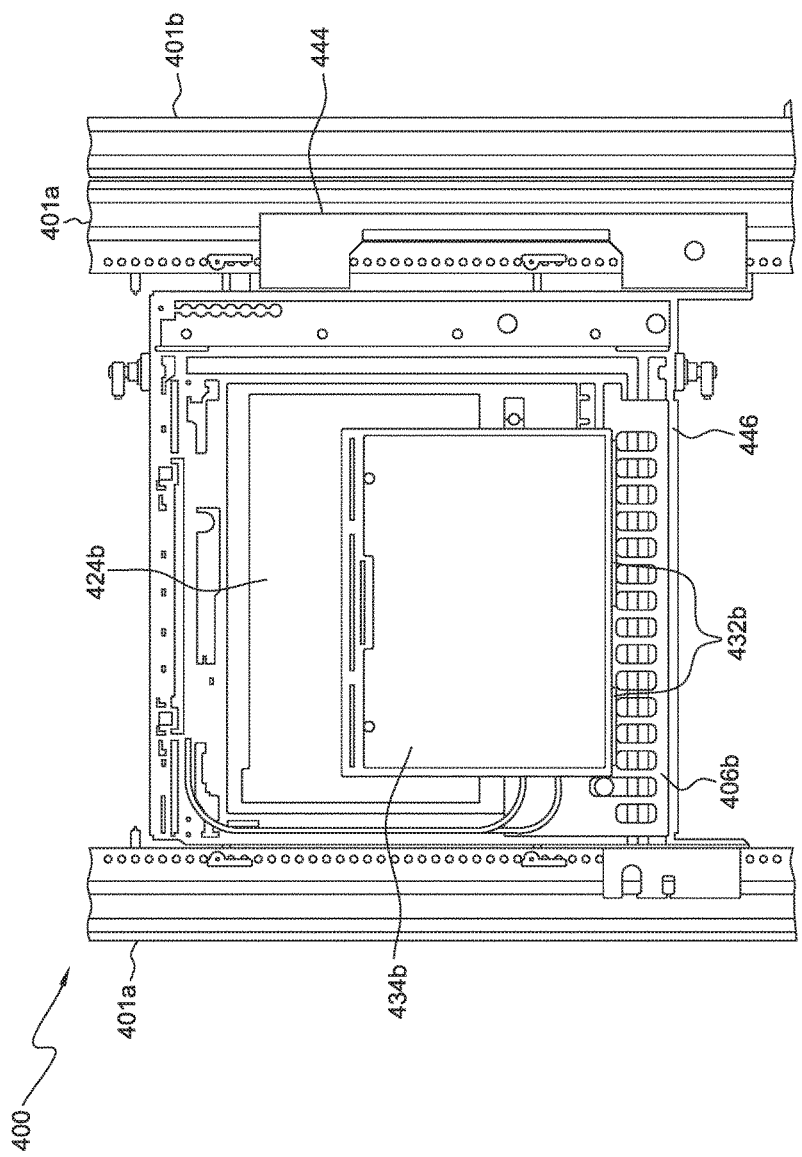
FIG. 11 is a front elevation view of the low-profile service element gate of FIG. 10, in accordance with an embodiment of the present invention.

FIG. 11 is a front elevation view of the low-profile service element gate of FIG. 10, in accordance with an embodiment of the present invention.

Display 424a and keyboard 434a provide an interface to a service element. Display 424b (see FIG. 11) and keyboard 434b (see FIG. 11) provide an interface to a service element. In one embodiment, the interface provided by display 424a and keyboard 434a is redundant with the interface provided by display 424b and keyboard 434b. For example, each interface is an interface to one or more service elements. In one embodiment, the service element is a computing device. For example, the service element is a computing device that is mounted in a computing rack (e.g., one of frame 401a and frame 401b) that manages other computing devices mounted in the computing rack (e.g., one of frame 401a and frame 401b).

Second tray 406b has a first position and a second position. FIG. 11 depicts second tray 406b in the first position. In the first position, back surface 410 (see FIG. 10) of second tray 406b is positioned adjacent to back surface 436 (see FIG. 10) keyboard 434a. When second tray 406b is in the first position, as depicted in FIG. 10, FIG. 10 depicts second tray 406b in the second position. In the second position, second tray 406b is rotated on hinge 446 such that back surface 410 of second tray 406b is rotated away from back surface 436 of keyboard 434a. Rotating second tray 406b from the second position to the first position requires first rotating keyboard 434a such that keyboard 434a is parallel with front surface 408 of first tray 406a.

While second tray 406b is in the first position, as depicted in FIG. 11, display 424b and keyboard 434b are accessible by a user; however, display 424a and keyboard 434a are obscured by second tray 406b. While second tray 406b is in the second position, as depicted in FIG. 10, display 424a and keyboard 434a are accessible by a user; however display 424b and keyboard 434b are oriented upside-down (i.e., rotated along a horizontal axis approximately one hundred eighty degrees). When second tray 406b is in the second position, front surface 408 of first tray 406a and back surface 410 of second tray 406b face substantially the same direction (e.g., within approximately ten degrees of the same direction).

Various computing components can be mounted to one or both of frame 401. In this case, computing components are mounted to frame 401 behind first tray 406a. That is, first tray 406a is disposed between the mounted components and keyboard 434a. In one embodiment, the computing components include one or more service elements. For example, display 424a and keyboard 434a provide an interface with a first service element and display 424b and keyboard 434b provide an interface with a second service element.

In one embodiment, a door (not shown) is mounted to frame 401. In this embodiment, SE gate 400 is configured to allow the door to close without interference from the components of SE gate 400. For example, the door, when closed, leaves a clearance depth between the door and any mounted computing components. In this example, the clearance depth is greater than the combined depth of first tray 406a, display 424a, and keyboard 434a and the clearance depth is also greater than the combined depth of second tray 406b, display 424b, and keyboard 434b. Further, primary hinge 444 positions first tray 406a relative to frame 401 at a position that avoids interference with the door by the components of SE gate 400 (e.g., first tray 406a, display 424a, keyboard 434a, second tray 406b, display 424b, and keyboard 434b).

Unless stated otherwise, each hinge rotates on an axis suggested by the manner suggested by the orientation and configuration as depicted in FIGS. 1-11.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An apparatus for positioning service elements, the apparatus comprising:
   a gate affixed to a computing rack by a gate hinge, wherein the gate hinge rotates on a first axis;
   a first tray affixed to the gate at a side edge of the first tray;
   a second tray affixed to the first tray at a bottom edge of the first tray by a hinge that rotates on a second axis that is perpendicular to the first axis;
   a first display and a first keyboard affixed to an outer surface of the first tray; and
   a second display and a second keyboard affixed to an outer surface of the second tray;
   wherein the second tray has a first position in which a back surface of the second tray is positioned adjacent to a back surface of the first keyboard, and a second position in which the second tray is rotated 180 degrees from the first position.

2. The apparatus of claim 1, wherein the first keyboard is affixed to the outer surface of the first tray by a hinge that rotates on a third axis that is perpendicular to the first axis, and wherein the first keyboard has a stowed position that positions the first keyboard in parallel with the outer surface of the first tray and a deployed position that positions the first keyboard perpendicularly to the outer surface of the first tray.

3. The apparatus of claim 1, wherein the second keyboard is affixed to the outer surface of the second tray by a hinge that rotates on a third axis that is perpendicular to the first axis, and wherein the second keyboard has a stowed position that positions the second keyboard in parallel with the outer surface of the second tray and a deployed position that positions the second keyboard perpendicularly to the outer surface of the second tray.

4. The apparatus of claim 1, wherein the hinge by which the second tray is affixed to the first tray allows rotation of the second tray between the first position and the second position.

* * * * *